United States Patent [19]

Hartman et al.

[11] Patent Number: 4,663,829

[45] Date of Patent: * May 12, 1987

[54] PROCESS AND APPARATUS FOR CONTINUOUS PRODUCTION OF LIGHTWEIGHT ARRAYS OF PHOTOVOLTAIC CELLS

[75] Inventors: Robert A. Hartman; Paul E. Koch, both of Chagrin Falls, Ohio

[73] Assignee: Energy Conversion Devices, Inc., Troy, Mich.

[*] Notice: The portion of the term of this patent subsequent to May 12, 2004 has been disclaimed.

[21] Appl. No.: 786,781

[22] Filed: Oct. 11, 1985

[51] Int. Cl.$^4$ .............................. H01L 31/18
[52] U.S. Cl. .................................... 29/572; 29/589; 29/590; 136/258; 136/290; 156/345; 204/192.32; 204/298; 118/718; 118/719; 118/723; 118/724; 118/729; 427/39; 427/74; 427/86; 427/255.5
[58] Field of Search .............. 29/572, 589, 590; 136/258 PC, 258 AM, 290; 204/192 E, 298; 427/39, 74, 86, 87, 255.5, 295; 156/643, 345; 118/718, 719, 723, 724, 729

[56] References Cited

U.S. PATENT DOCUMENTS

| | | | |
|---|---|---|---|
| 3,969,163 | 7/1976 | Wakefield | 148/174 |
| 4,131,659 | 12/1978 | Authier et al. | 264/25 |
| 4,341,588 | 7/1982 | Sterling | 156/601 |
| 4,410,558 | 10/1983 | Izu et al. | 427/39 |
| 4,492,181 | 1/1985 | Ovshinsky et al. | 118/718 |

Primary Examiner—Aaron Weisstuch
Attorney, Agent, or Firm—Marvin S. Siskind; Richard M. Goldman

[57] ABSTRACT

A process and apparatus for continuously producing a relatively large-area, lightweight array of amorphous semiconductor alloy photovoltaic cells having no substrate includes depositing a semiconductor alloy film, such as amorphous silicon, on a travelling surrogate substrate, applying a support material to the traveling film to give it mechanical strength and separating the film and support material from the traveling surrogate substrate by exposing them to a thermal shock. The surrogate substrate is preferably an endless stainless steel band from which the deposited alloy film is repeatedly stripped and on which deposits are repeatedly made. The apparatus may include a cleaning station for cleaning the surrogate substrate after an alloy film is removed from the substrate and before another alloy film is deposited. The apparatus may provide for the deposition and patterning of a back electrode on the substrate before deposition of the alloy film to form one set of electrical interconnections for the array. The apparatus may also provide for the deposition and patterning of a transparent, electrically conducting layer on the alloy film, before application of the support material, in order to form a second set of electrical interconnections for the array. The apparatus may also apply a protective, support material to the rear of the alloy film.

16 Claims, 3 Drawing Figures

PROCESS AND APPARATUS FOR CONTINUOUS PRODUCTION OF LIGHTWEIGHT ARRAYS OF PHOTOVOLTAIC CELLS

BACKGROUND

Technology for manufacturing large-area photovoltaic cells from amorphous semiconductor alloys has been developed in recent years. Breakthroughs have been made in preparing amorphous semiconductor materials of electronic device quality. These high quality materials include hydrogen, fluorine, or a combination of the two in amorphous silicon, silicon-germanium, and germanium. It is believed that hydrogen and fluorine passivate or satisfy dangling bonds and other structural defects in the amorphous structure so that desirable charge carrier transport properties are achieved.

The principal method of preparing these amorphous semiconductor materials is glow discharge deposition. In that process, a gas mixture containing at least one semiconductor precursor gas, such as silane, disilane, silicon tetrafluoride, germane, and germanium tetrafluoride or mixtures of them, is admitted to a vacuum chamber held at a reduced pressure, typically 13 to 65 pascal. The gas mixture may also include hydrogen or argon as a diluent and a dopant precursor gas, such as diborne or boron trifluoride to deposit a p-type conductivity material or phosphine or phosphorus tetrafluroide to deposit an n-type conductivity material. The gas mixture also includes a source of hydrogen and/or fluorine. Material deposited without the presence of a dopant precursor gas is typically slightly n-type in conductivity, is substantially intrinsic and may be compensated to a higher resistivity with a trace of a p-type dopant, such as boron.

The gas mixture is admitted to the chamber through a fixture that forms a cathode. A glow discharge plasma is struck between the cathode and an electrically conductive substrate by impressing an electrical potential across the cathode and substrate. The glow discharge plasma is sustained by electrical power that may be direct current or may be alternating current up through the microwave frequency range. The glow discharge disassociates the gas mixture into various species that deposit on the substrate and build up the depositing alloy. By changing dopant precursor gases during the deposition process, p-n, p-i-n, and more complex device structures may be deposited. Three layer p-i-n and multiple p-i-n amorphous silicon alloy and amorphous silicon-germanium alloy structures have proven particularly useful as photovoltaic devices.

The process of producing glow discharge deposited amorphous photovoltaic devices has been developed to permit continuous production of such materials over large areas. For example, methods for the continuous production of amorphous photovoltaic material on large-area, flexible metallic substrates has ben disclosed in U.S. Pat. Nos. 4,400,409 to Izu et al. for Method of Making P-Doped Silicon Films; No. 4,410,558 and No. 4,519,339 to Izu et al. for Continuous Amorphous Solar Cell Production System; No. 4,485,125 to Izu et al. for Method for Continuously Producing Tandem Amorphous Photovoltaic Cells; No. 4,492,181 to H. Ovshinsky et al. for Method for Continuously Producing Tandem Amorphous Photovoltaic Cells; and No. 4,514,437 to Nath for Apparatus for Plasma Assisted Evaporation of Thin Films and Corresponding Methods of Deposition. The disclosures of these patents are incorporated herein by reference. Apparatus for depositing complex amorphous semiconductor alloy devices on flexible substrates 30 cm. wide and over 300 m. long has been built and is now operating.

More recently very lightweight amorphous semiconductor alloy arrays of photovoltaic cells have been constructed from continuously deposited alloy materials. These lightweight cells have an exceptionally high specific power, i.e. power output to mass ratio. The lightweight cells are prepared in the way described above, but on a very thin substrate, such as electroformed metal foil, or a metal substrate that is chemically etched to an unconventional thinness, or on an insulator intially supported by a metal substrate that is completely removed by chemical etching after deposition of the amorphous alloy. See U.S. patent application Ser. No. 696,390 filed Jan. 30, 1985, by Hanak for Extremely Lightweight, Flexible Semiconductor Device Arrays and Method of Making Same. It is desirable to fabricate these extremely lightweight arrays directly from continuous processing machinery rather than to thin or remove a conventional thickness substrate in order to reduce the number of process steps and thereby to improve yield and to reduce cost. It is also desirable to avoid use of a very thin electroformed foil because of the special care required in handling that delicate foil.

SUMMARY OF THE INVENTION

In the invention, extremely lightweight, large-area arrays of amorphous semiconductor alloy solar cells are continuously fabricated by depositing an alloy film on a surrogate substrate, laminating a support material to the film opposite the surrogate substrate and separating the film and support material from the substrate by exposing them to a thermal shock. In a preferred embodiment of the invention, the surrogate substrate is an endless band that cycles through a deposition apparatus. The alloy film is deposited, preferably by glow discharge, to form a preselected photovoltaic structure, the support material is applied and the film is then peeled from the surrogate substrate. The substrate is then cleaned, for example, in an etching glow discharge, and cycled back into the deposition chambers for receiving an alloy film deposit. The deposition, lamination, peeling and cleaning processes all preferably proceed continuously.

The surrogate substrate is chosen to have a thermal coefficient of expansion different from that of the allow film to aid their separation. A thermal shock may be applied by passing the film and surrogate substrate through a path of an inert low temperature fluid, such as liquid nitrogen or by passing the film and substrate between rollers, one of which is heated or cooled. For a silicon alloy photovoltaic film, it is preferred to form the surrogate substrate from stainless steel.

Other processing steps may be used to form electrical contacts on the lightweight array, to laminate additional protective layers to the alloy film and to eliminate any electrical defects that may result from separating the alloy film from the substrate.

DETAILED DESCRIPTION OF PREFERRED EMBODIMENTS

Figure 1:
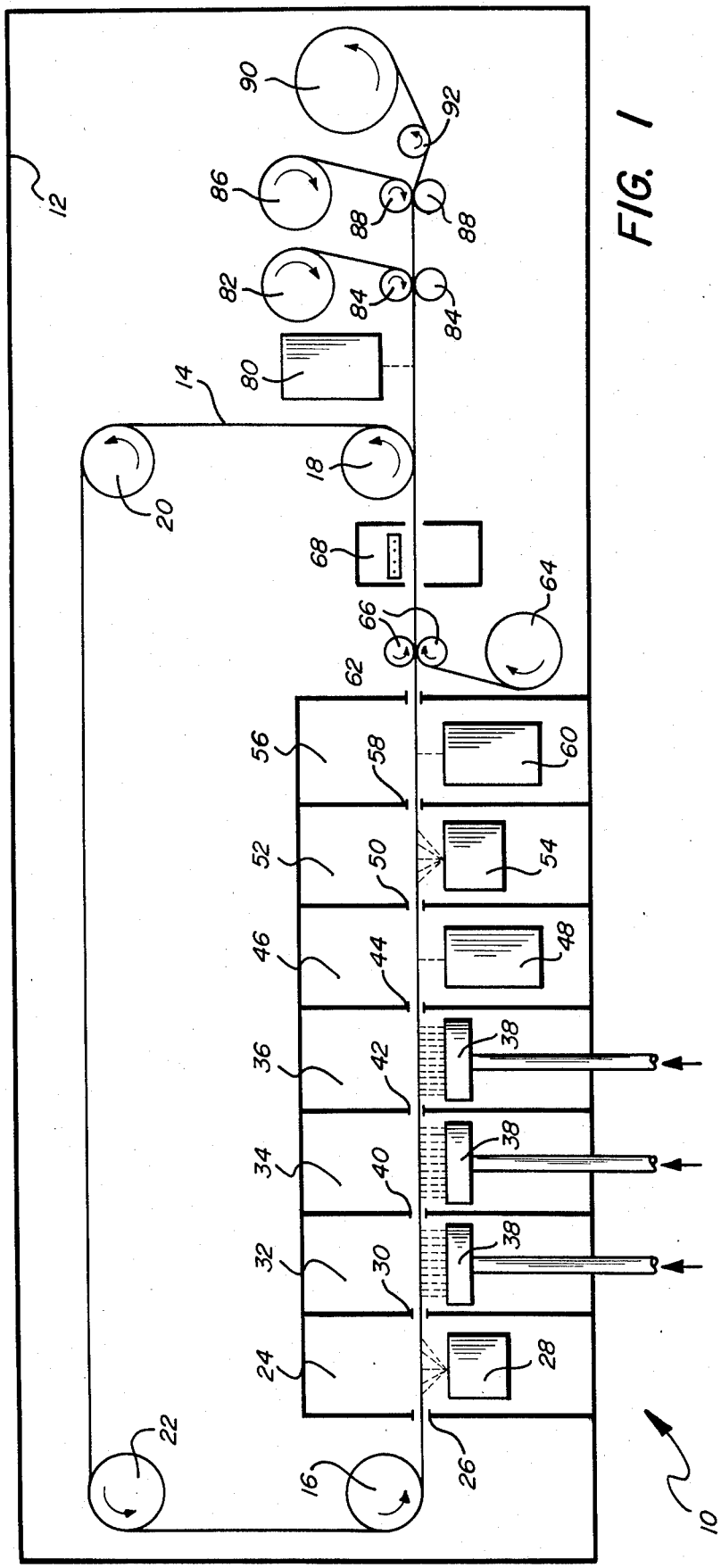
FIG. 1 is a schematic, cross sectional view of an embodiment of an apparatus according to the invention for carrying out the inventive process.

An embodiment of a novel apparatus 10 for carrying out the inventive process is shown in a schematic, cross sectional view in FIG. 1. In general, apparatus 10 includes a large vacuum envelope 12 in which a subatmospheric pressure may be established and maintained by vacuum pumps (not shown). Within envelope 12 there are various chambers, some communicating with others, in which the ambient gases and pressures may be independently controlled.

Within envelope 12 an endless surrogate substrate 14, preferably of stainless steel or some other material that has a thermal coefficient of expansion substantially different from that of amorphous semiconductor alloys, is trained around four rollers 16, 18, 20, and 22. These rollers are driven by a motor (not shown) to move the endless substrate through envelope 12. Additional tensioning and steering rollers may be used to keep surrogate substrate 14 taut and to maintain its sideways alignment during travel, respectively.

Substrate 14 is treated in various ways within envelope 12 and the following description is merely illustrative of one possible sequence of treatments. Some of the described treatments can be omitted, others added and some of those shown can be performed multiple times. As moving substrate 14 travels away from roller 16 toward roller 18, it enters a chamber 24 through a gas gate 26. Gas gate 26 is supplied with an inert gas that sweeps across and through the opening of chamber 24 to isolate its environment from that of envelope 12. Examples of such gas gates are described in U.S. Pat. Nos. 4,438,724 to Doehler et al. for Grooved Gas Gate; No. 4,450,786 to Doehler et al. for Grooved Gas gate; No. 4,462,332 to Nath et al. for Magnetic Gas Gate; No. 4,480,585 to Gattuso for External Isolation Moduel; and No. 4,537,795 to Nath et al. for Method for Introducing Sweep Gases Into a Glow Discharge Deposition Apparatus. The disclosures of these patents are incorporated herein by reference.

Within chamber 24 a metal or metal alloy film is deposited on substrate 14 to form an electrode, called a back electrode because of its location at the rear of the photovoltaic cells to be formed, for electrical interconnection of the photovoltaic cells to be produced. The back electrode may also be reflective to reflect back into the cell for absorption light that reaches the bottom of the cell. The back electrode may be deposited by sputtering, as illustrated by a sputtering source 28 disposed within chamber 24. Other processes, such as radio frequency sputtering or a vapor deposition, can be used to deposit the back electrode.

After the deposition of the conducting layer for the back electrode, substrate 14 moves out of chamber 24, through another gas gate 30 into an adjacent chamber 32. While chambers 24 and 32 are shown as adjacent, they may be separated within envelope 12 and an exit gas gate may be fitted to chamber 24 and an entrance gas gate fitted to chamber 32. For simplicity, however, the chambers are shown adjacent in FIG. 1 with a single gas gate between them. Likewise, other chambers within envelope 12 are shown as adjacent, but it is understood they may be separated and two gas gates may be required where only one is shown in FIG. 1.

Chamber 32 is the first of three related chambers, 32, 34, and 36. In each of these chambers, a layer of an amorphous semiconductor alloy film is deposited by establishing and maintaining a glow discharge in a gas mixture containing at least one semiconductor precursor gas. A combination cathode and gas dispenser 38 is shown disposed in each of chambers 32, 34, and 36. Examples of such cathodes are described in U.S. Pat. Nos. 4,369,730 to Izu et al. for Cathode for Generating a Plasma; and No. 4,483,883 and No. 4,513,684 both to Nath et al. for Upstream Cathode Assembly, the disclosures of which are incorporated herein by reference. Each cathode is driven by an electrical energy source (not shown) supplying direct current or alternating current at a frequency through the microwave range. Substrate 14 is electrically connected to the electrical energy source so that a glow discharge may be established and maintained in each of chambers 32, 34, and 36 between substrate 14 and the respective cathodes 38.

Chambers 32, 34, and 36 are interconnected by gas gates 40 and 42, respectively, so that their respective gas mixtures are isolated from each other. Those gas mixtures are supplied to cathodes 38 as indicated by the arrows. As is known in the art, the gas mixtures contain not only at least one semiconductor precursor gas, such as silane, disilane, silicon tetrafluoride, germane, germanium tetrafluoride and mixtures of these gases, but also a source of hydrogen and/or fluorine to passivate defects in the deposited amorphous semiconductor alloy. In addition, a diluent gas such as argon or hydrogen may be supplied. The apparatus shown is specifically intended to deposit a p-i-n or n-i-p structure. That is, a dopant precursor gas, such as diborane or boron trifluoride is added to the gas mixture in chamber 32 or 36 to deposit a p-type conductivity layer. Another dopant precursor gas, such as phosphine phorosphorus pentachloride, is added to the gas mixture in the other of chambers 32 or 36 to deposit a n-type layer. Either dopant precursor gas or only trace amounts of a p-type dopant precursor gas are added to the gas mixture in chamber 34 to deposit a substantially intrinsic type layer in that chamber. Thus a p-i-n or n-i-p structure is formed. If a simpler structure is desired, one or more chambers can be removed. If a more complex structure, such as a tandem or two cell structure, is desired, additional deposition chambers can be added to apparatus 10.

Upon completion of the deposition of the three layer amorphous semiconductor alloy film on substrate 14 (or on the back electrode), substrate 14 exits chamber 36 through a gas gate 44 and enters chamber 46. If desired, the deposited film can be formed into patterns of cells in chamber 46. A laser scriber 48 is disposed in chamber 46. Scriber 48 can form a desired pattern of cells in the alloy film by scanning its relatively high powered beam across the film in a preselected pattern, removing the film where the beam strikes. Such scribers are disclosed in U.S. Pat. No. 4,292,092 to Hanak, which is incorporated herein by reference.

After the treatment in chamber 46, if any, the combined alloy film and substrate move through a gas gate 50 into another deposition chamber 52. In chamber 52 a transparent, electrically conductive layer, such as a transparent oxide like indium tin oxide, tin oxide, or cadmium tin oxide, is deposited on the alloy film. This conductive layer forms another electrode, commonly called the front electrode because of its position on the light-incident side of the photovoltaic cell, on the array of lightweight photovoltaic cells being fabricated. The deposition process for the transparent, electrically conductive layer may be chosen from numerous known processes such as magnetron sputtering and evaporation. A sputtering source 54 is shown disposed in chamber 52 to carry out one embodiment of that process.

In a final, optional processing step, the alloy film with its conducting layer moves out of chamber 52 into an adjacent chamber 56 through a gas gate 58. In chamber 56, the transparent conducting layer is formed into patterns of interconnections by a scanning laser scriber 60 disposed in the chamber. Laser 60 works in a fashion similar to that of laser scriber 48, selectively removing the transparent conducting material wherever its beam strikes to leave a preselected pattern of conductors interconnecting the photovoltaic cells.

After any patterning of the transparent conducting layer, the cells are electrically complete and ready to be peeled away from substrate 14. However, the alloy film, back reflector and front electrode layer are no more than 1.0 micrometer in thickness and are frequently thinner. These thin films are too delicate for direct handling, so a support material is bonded to the front electrode to add mechanical strength before further processing. The substrate and deposited layers exit from chamber 56 through a final gas gate 62 to a laminating station. There, a laminate, which must be transparent if the alloy film is to be used for photovoltaic applications, is applied to the film or front electrode on the face opposite substrate 14. Ethylene vinyl acetate is one such support material. The support material is fed from a supply coil 64 to a pair of rollers 66 through which the substrate and film pass. Rollers 66 are preferably moderately heated to bond the support material to the alloy film and apply the minimum possible pressure in order to avoid damage to the film. Alternatively, the support material may be coated with a pressure sensitive adhesive for bonding to the alloy film. The structure thus produced has sufficient strength to withstand further handling and is therefore ready to be separated from substrate 14.

The substrate, alloy film, and support material next pass to a separating station 68 where they are exposed to a differential thermal shock. Because the thermal coefficients of expansion of the substrate and the alloy film and support material are different, the thermal shock causes them to separate from each other. Substrate 14 then continues around roller 18 to be cleaned and used again in the continuous processing. The alloy film with its support layer continues on for further separate processing as explained below.

Figure 3:
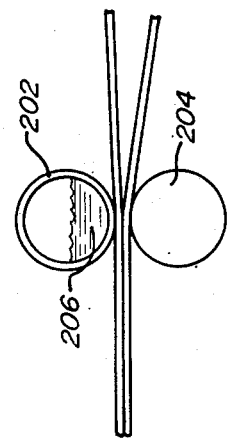
FIG. 3 is a schematic, cross sectional view of another apparatus for applying a thermal shock according to another embodiment of the invention.
Figure 2:
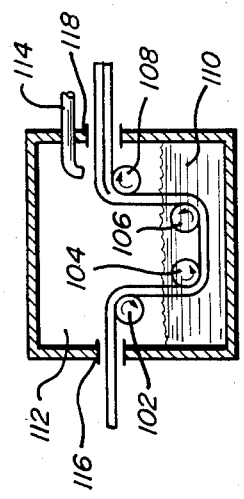
FIG. 2 is a schematic, cross sectional view of an apparatus for applying a thermal shock according to an embodiment of the invention.

Various means may be used to apply a thermal shock to the substrate-alloy film combination at station 68. Preferred embodiments of thermal shock means are shown in FIGS. 2 and 3. In FIG. 2, the assembly passes through a cooled fluid bath that results in the desired separation. In that embodiment, the assembly passes over rollers 102, 104, 106, and 108 that direct the assembly into a liquid bath 110 within a chamber 112. Bath 110 may be liquid nitrogen that is periodically replenished through an inlet 114. The use of a volatile liquid as the bath requires that station 68 be fitted with entrance and exit seals 116 and 118 that contain the fluid within chamber 112 and isolate it from the volume outside chamber 112, but inside vacuum envelope 12. Alternatively, it might be desirable to place chamber 112 outside envelope 12.

Another embodiment of a thermal shock means is shown in FIG. 3. There, a pair of oppositely disposed rollers 202 and 204 contact the substrate and alloy film, respectively. Roller 202 contacts surrogate substrate 14 and contains a liquid 206, either a relatively cold liquid, such as liquid nitrogen, or a relatively hot liquid. The heat transfer between roller 202 and substrate 14 provides a thermal shock that separates the substrate from the alloy film. This embodiment is superior to that of FIG. 2 in that no additional seals are required to isolate the processing step. Rather, the rolls may extend beyond envelope 12 or the interior of roller 202 may be accessible from outside envelope 12 to permit continuous circulation of the liquid through roller 202 to maintain a desired temperature.

After surrogate substrate 14 is separated from the alloy film, it passes over rollers 18 and 20 on its route to roller 16 for continued use. Because the separation of the alloy film from substrate 14 may not be perfect, some residue may be left on the substrate. It is desirable to remove any residue in order to maintain a high quality of continuously deposited alloy film. Substrate 14 therefore travels from roller 20 through a cleaning station 70. Station 70 includes entrance an exit gas gates 72 and 74 for isolating the gases within cleaning chamber 76 from envelope 12. A cathode 78, much like the glow discharge cathodes 38 used in chambers 32, 34, and 36, is disposed in cleaning chamber 76. By admitting an appropriate gas mixture to chamber 76, establishing appropriate process conditions, and igniting a glow discharge between substrate 14 and cathode 78, an etching process, rather than a depositing process, may be carried out. The etching cleans substrate 14 and prepares it for receiving further deposits. After cleaning, substrate 14 passes over roller 22 and back to roller 16.

After the alloy film and support material are separated from substrate 14, there may be further processing. When the alloy film is stripped from substrate 14, the back electrode, if one was deposited, is accessible. That back electrode may be formed into a pattern of electrical interconnections with a laser scriber in the same manner as the alloy film and transparent conductive layer were patterned. A laser 80 is disposed in envelope 12 adjacent the exposed back electrode to scan over a preselected pattern, removing portions of the conductive layer where it strikes and leaving behind the desired electrical interconnections. Laser 80 is shown within envelope 12, but may be contained within a chamber to contain and collect the debris produced in the laser scribing process.

After the back electrode is patterned, additional metallization may be applied to complete electrical connections to the "substrate" side of the photovoltaic array. These contacts may be predeposited on a roll of a material that is applied to the alloy film in registration with the pattern produced by laser 80 or may be a continuous, skeletal web of contacts wound on a roll that is applied to the film in registration with the patterned back contact. A coil 82 of such a film or skeletel web is disposed near the separated alloy film and is bonded to the patterned back electrode between a pair of rollers 84 disposed on opposite sides of the film. The bonding may be thermally assisted.

Finally, a support material may be applied to the backside of the photovoltaic array for added strength and protection, without substantial addition of weight. A supply roll 86 of a lightweight polymeric film such as ethylene vinyl acetate, a fluoropolymer, an acrylic, or a polyimide is applied to the alloy film between two rollers 88 disposed on opposite sides of the alloy. The polymeric film may be themally bonded to the alloy film or a pressure sensitive adhesive may be used.

The completed lightweight, large-area array of photovoltaic cells is then collected and stored on a take-up coil 90. A steering and tensioning roller 92 between rollers 88 and take-up coil 90 maintains the proper tension on the alloy film and maintains it in the appropriate side-to-side position.

The alloy film separates relatively easily from a substrate, like surrogate substrate 14. The process, however, may damage the alloy film or its electrical interconnections. When a liquid nitrogen thermal shock is applied to an alloy film on a substrate, the separation readily occurs, although some pin holes are created in the amorphous semiconductor alloy film resulting in short circuiting of some of the photovoltaic cells. The effects of these short circuits may be eliminated in numerous ways. An electrically insulating fluid that fills the pin holes, such as a cureable photoresist, may be applied to the back electrode side of the array and cured. Alternatively, an etchant that selectively etches the transparent conductive layer may be applied to the back electrode side of the array. The etchant isolates the short circuited cells and improves the performance of the array by removing the effects of the inoperative cells.

While FIG. 1 is described with respect to a particular sequence of processing, the processing steps may be performed in a different sequence or some steps may be deleted and others added. For example, it may be desirable to deposit the alloy film directly on surrogate substrate 14 by omitting the deposition of the back electrode until other processing is complete. In that case, all processing after the separation of surrogate substrate 14 from the alloy film would be omitted from apparatus 10 and would be performed in different apparatus. The alloy film and transparent conductive layer on the front side of the array might not be formed into patterns in apparatus 10 to avoid creating the debris produced in both processes. Again, in that processing sequence, no further processing steps would be performed in apparatus 10 after the separation of the alloy film from the surrogate substrate. Rather, the alloy film could be formed into patterns by water jet or laser scribing or by chemical or electrochemical etching from the back side of the alloy film. After this processing, electrical contacts would be applied to the back side of the alloy film and finally a laminate applied to the back side to protect and strengthen the assembly.

While the apparatus of FIG. 1 shows surrogate substrate 14 as an endless band, continuous processing could also be achieved with a very long, e.g. 300 m., surrogate substrate. Roller 22 would be replaced by a supply coil of substrate material and roller 20 would be replaced by a take-up reel, collecting the surrogate substrate after the alloy film has been deposited and separated from it. The cleaning step could be omitted and the substrate would be cleaned in a separate apparatus between depositions.

The invention has been described with respect to certain preferred embodiments. Various modifications and additions within the spirit of the invention will occur to those of skill in the art. Therefore, the scope of the invention is limited solely by the following claims.

We claim:

1. A process for producing relatively large-area, lightweight arrays of amorphous semiconductor alloy photovoltaic cells comprising:
   continuously depositing a thin semiconductor alloy film on an endless traveling surrogate substrate having a coefficient of thermal expansion different from that of said alloy film;
   continuously applying a transparent support material to the surface of said deposited thin semiconductor alloy film opposite said traveling surrogate substrate;
   continuously exposing said deposited thin semiconductor alloy film and traveling surrogate substrate to a thermal shock to continuously separate said alloy film and support material from said surrogate substrate; and
   cleaning said traveling surrogate substrate after separating said alloy film from it and before deposition an alloy film on it again.

2. The process of claim 1 including cleaning said surrogate substrate by establishing an etching glow discharge between a cathode and said surrogate substrate.

3. The process of claim 1 including depositing said alloy film continuously by establishing and maintaining a glow discharge in at least one gaseous mixture containing at least one semiconductor precursor gas.

4. The process of claim 3 including depositing said alloy film in a plurality of layers by establishing and maintaining a plurality of glow discharges in a plurality of gaseous mixtures, each gas mixture containing at least one semiconductor precursor gas for depositing a thin film semiconductor alloy layer and some of said gas mixtures containing a dopant precursor gas for depositing a doped thin film semiconductor alloy layer.

5. The process of claim 4 including depositing, in sequence, a layer of said alloy film of a first conductivity type, a layer of substantially intrinsic conductivity type, an a layer of a second conductivity type opposite from that of said first conductivity type.

6. The process of claim 1 wherein said surrogate substrate comprises stainless steel.

7. The process of claim 1 including continuously passing said deposited alloy film and said traveling surrogate substrate through a low temperature fluid to create said thermal shock.

8. The process of claim 7 wherein said low temperature fluid comprises liquid nitrogen.

9. The process of claim 1 including continuously depositing a transparent, electrically conducting layer on said alloy film before applying said support material.

10. The process of claim 9 including etching said transparent, electrically conducting layer from the side of said alloy film opposite said support material to remove electrical defects from said array.

11. The process of claim 9 including applying an electrically insulating liquid to the side of said alloy film opposite said support material to remove electrical defects from said array.

12. Apparatus for producing relatively large-area, lightweight arrays of thin film semiconductor alloy photovoltaic cells comprising:
   means for continuously depositing a thin film of semiconductor alloy material on an endless surrogate substrate traveling through said apparatus, said surrogate substrate having a coefficient of thermal expansion different from that of said alloy film;
   means for driving said endless band;

means for continuously applying a transparent support material to be deposited film opposite said traveling surrogate substrate;

means for continuously applying a thermal shock to said deposited thin film semiconductor alloy film and said surrogate substrate to separate said alloy film and support material from said surrogate support continuously; and means for continuously cleaning said endless band after said alloy film and support material are separated from said band.

13. The apparatus of claim 12 wherein said means for cleaning includes an electrode and means for establishing and maintaining an etching glow discharge between said electrode and said band.

14. The apparatus of claim 12 wherein said means for continuously depositing a thin film semiconductor alloy film comprises at least one glow discharge deposition chamber containing a cathode for establishing a glow discharge plasma between said cathode and surrogate substrate in a gas mixture admitted to said chamber and containing at least one semiconductor precursor gas.

15. The apparatus of claim 12, including at least three glow discharge deposition chambers disposed sequentially, said first and third chambers being dedicated to depositing opposite conductivity type layers of a thin film semiconductor alloy, said second chamber being dedicated to depositing a substantially intrinsic layer of a thin film semiconductor alloy.

16. The apparatus of claim 12 wherein said means for applying a thermal shock comprises a reservoir for containing a low temperature fluid bath through which said traveling surrogate substrate may pass.

* * * * *